United States Patent
Fujii et al.

(10) Patent No.: US 7,008,752 B2
(45) Date of Patent: Mar. 7, 2006

(54) PHOTOSENSITIVE RESIN COMPOSITION AND USE OF THE SAME

(75) Inventors: Hirofumi Fujii, Ibaraki (JP); Yasuhito Funada, Ibaraki (JP); Satoshi Tanigawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/081,516

(22) Filed: Mar. 17, 2005

(65) Prior Publication Data

US 2005/0208421 A1     Sep. 22, 2005

(30) Foreign Application Priority Data

Mar. 17, 2004   (JP)   ............ P.2004-076146

(51) Int. Cl.
 *G03F 7/004*   (2006.01)
 *C08F 2/46*   (2006.01)
(52) U.S. Cl. .............. 430/270.1; 430/283.1; 430/330; 522/34; 522/50
(58) Field of Classification Search .......... None
See application file for complete search history.

(56) References Cited

FOREIGN PATENT DOCUMENTS

| | | | |
|---|---|---|---|
| JP | 49-011541 | A | 2/1974 |
| JP | 50-140922 | A | 11/1975 |
| JP | 54-145794 | A | 11/1979 |
| JP | 56-038038 | A | 4/1981 |
| JP | 06-075376 | A | 3/1994 |
| JP | 07-271034 | A | 10/1995 |
| JP | 07-281441 | A | 10/1995 |
| JP | 2002-148804 | A | 5/2002 |

*Primary Examiner*—Rosemary Ashton
(74) *Attorney, Agent, or Firm*—Sughrue Mion, PLLC

(57) ABSTRACT

A photosensitive resin composition which, when exposed to light through a photomask and then developed, can form a pattern comprising a polyimide film having a thickness of 20 $\mu$m or larger with high resolution; and a use of the composition, in particular, a method of forming a pattern comprising the polyimide film. The photosensitive resin composition comprises (a) a poly(amic acid), (b) a specific 1,4-dihydropyridine derivative, and (c) a specific imide acrylate compound.

3 Claims, No Drawings

PHOTOSENSITIVE RESIN COMPOSITION AND USE OF THE SAME

FIELD OF THE INVENTION

The present invention relates to a photosensitive resin composition capable of forming, with high resolution, a pattern comprising a polyimide film having a thickness of 20 μm or larger. The invention further relates to a use of the composition, in particular, a method of forming a pattern comprising the polyimide film.

BACKGROUND OF THE INVENTION

Thin inorganic films formed by CVD have usually been used as interlayer insulating films between wirings in semiconductor devices. As the insulating films for rewiring to be formed on semiconductor devices, thin resin films having a thickness of 20 μm or smaller formed from a photosensitive polyimide resin or photosensitive polybenzoxazole resin are generally used.

In recent years, the operating frequencies of semiconductor devices are increasing so as to cope with the increases in the amount and rate of information communication. In addition, the trend toward size reduction in semiconductor devices for improving the portability and handiness of electronic appliances has resulted in an increased wiring density and a reduced wiring line width. As a result, a decrease in signal voltage due to wiring resistance has come to be pointed out, although this decrease has hitherto been not problematic. On the other hand, a device called a system-on-chip has been proposed. It is a semiconductor chip having all of functions which have hitherto been formed separately on respective semiconductor chips and connected to each other on a circuit board. In this technique, long wirings having a narrow line width are required because different functions are connected to each other on the same chip. It has been proposed to increase the thickness of these wirings on a semiconductor in order to prevent the decrease in signal voltage caused by wiring resistance. In this case, however, a wiring thickness of 10 μm or larger and an insulating layer thickness of 20 μm or larger are expected to be required in the future because the interlayer insulating film should have a thickness sufficiently larger than the wiring thickness.

However, the thicknesses of inorganic films which can be formed by CVD are generally 1 μm or smaller when the productivity thereof is taken into account. Even in the case of the photosensitive polyimides (see documents 1 to 4) and photosensitive polybenzoxazole (see document 5) for use as passivation films in semiconductor devices, it is extremely difficult to deposit a film in a thickness of 20 μm or larger because of a decrease in resolution. Namely, in the case of positive photosensitive materials among those, actinic rays do not reach the interface between the substrate and the resin and, hence, it is difficult to form an image having a thickness of 20 μm or larger through the curing of the photosensitive materials. On the other hand, the negative photosensitive materials heretofore in use can form an image having a thickness of 20 μm or larger. However, use of the negative photosensitive materials has problems that only those parts near the surface to which actinic rays reach are crosslinked and cured and, hence, the resultant pattern has an umbrella shape called a reversed taper, and that because of the insufficient exposure amount, a semi-cured material remains as a residue after development.

Under these circumstances, a photosensitive polyimide of the dissolution control type employing a 1,4-dihydropyridine derivative as a photosensitizer has recently been proposed (see documents 6 and 7). This photosensitive polyimide is free from the problem in existing negative materials that a residue of the photosensitive material remains after development. Furthermore, the disadvantage that the photosensitive polyimide gives a pattern having a taper shape can be mitigated to some degree by conducing a heating (post-exposure heating) treatment after exposure and before development. In particular, incorporation of polyethylene glycol as a development accelerator into the photosensitive polyimide has enabled the photosensitive material to give an image which has a sufficient heat treatment margin even when the thickness thereof after cure is as large as 20 μm or more (see documents 7 and 8). However, since this photosensitive material tends to give patterns having a normal taper shape in contrast to negative materials heretofore in use, the resolution of such patterns comprising a thick film is about 40–50 μm at the most.

Other photosensitive materials which have been proposed include a photosensitive epoxy resin. However, this epoxy resin has a higher permittivity and a higher dielectric loss than the photosensitive materials described above and these properties result in a reduced rather than increased signal voltage, leading to a decrease in SN ratio.

Document 1: JP-A-49-011541
Document 2: JP-A-50-140922
Document 3: JP-A-54-145794
Document 4: JP-A-56-038038
Document 5: JP-A-07-281441
Document 6: JP-A-06-075376
Document 7: JP-A-07-271034
Document 8: JP-A-2002-148804

SUMMARY OF THE INVENTION

The present invention has been achieved in order to eliminate the above-described problems of photosensitive resin compositions. An object of the invention is to provide a photosensitive resin composition which, when exposed to light through a photomask and then developed, can form a pattern comprising a polyimide film having a thickness of 20 μm or larger with high resolution. Another object of the invention is to provide a use of the composition, in particular, a method of forming a pattern comprising the polyimide film.

The present invention provides a photosensitive resin composition which comprises
(a) a poly(amic acid),
(b) a 1,4-dihydropyridine derivative represented by the general formula (I):

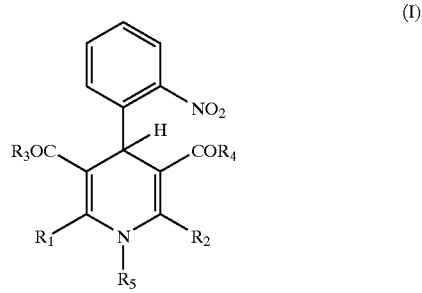

(wherein $R_1$ and $R_2$ each independently represent a hydrogen atom or an alkyl group having 1–4 carbon atoms; $R_3$ and $R_4$ each independently represent an alkyl or alkoxy group each having 1–4 carbon atoms; and $R_5$ represents a hydrogen atom, an alkyl group having 1–4 carbon atoms, or a carboxyalkyl group in which the alkyl moiety has 1–4 carbon atoms), and (c) an imide acrylate compound represented by the general formula (II):

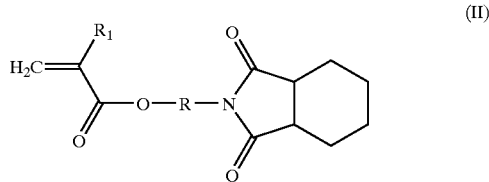

(II)

(wherein $R_1$ represents a hydrogen atom or methyl and R represents a hydrocarbon group having 2 or more carbon atoms).

The present invention further provides a method of forming a pattern comprising a polyimide film, which comprises forming a film of the photosensitive resin composition, exposing the film to light through a photomask, subjecting the film to post-exposure heating, developing the film, and then heating the developed film to imidize the poly(amic acid).

According to the photosensitive resin composition of the invention, a pattern comprising a polyimide film having a thickness of 20 μm or larger can be formed with high resolution.

DETAILED DESCRIPTION OF THE INVENTION

The poly(amic acid) is obtained by reacting a tetracarboxylic dianhydride with a diamine in a substantially equimolar proportion in an appropriate organic solvent such as, e.g., N,N-dimethylacetamide or N-metyl-2-pyrrolidone.

Examples of the tetracarboxylic dianhydride include 3,3', 4,4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 4,4'-oxydiphthalic dianhydride, 2,2-bis(2,3-dicarboxylphenyl)hexafluoropropane dianhydride, 2,2-bis(3,4-dicarboxyphenyl)hexafluoropropane dianhydride (6FDA), bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, pyromellitic dianhydride, and ethylene glycol bistrimellitate dianhydride. These may be used alone or in combination of two or more thereof.

On the other hand, examples of the diamine include 4,4'-diaminodiphenyl ether, 3,4'-diaminodiphenyl ether, 3,3'-diaminodiphenyl ether, m-phenylenediamine, p-phenylenediamine, 4,4'-diaminodiphenylpropane, 3,3'-diaminodiphenylpropane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, hexamethylenediamine, 1,8-diaminooctane, 1,12-diaminododecane, 4,4'-diaminobenzophenone, and 1,3-bis(3-aminopropyl)-1,1,3,3-tetramethyldisiloxane. These also may be used alone or in combination of two or more thereof.

The photosensitive resin composition according to the present invention may be obtained by yielding a poly(amic acid) in an organic solvent in the manner described above and mixing an 1,4-dihydropyridine derivative and an imide acrylate compound with the poly(amic acid) solution to dissolve these ingredients.

The 1,4-dihydropyridine derivative to be used in the present invention is represented by the general formula (I):

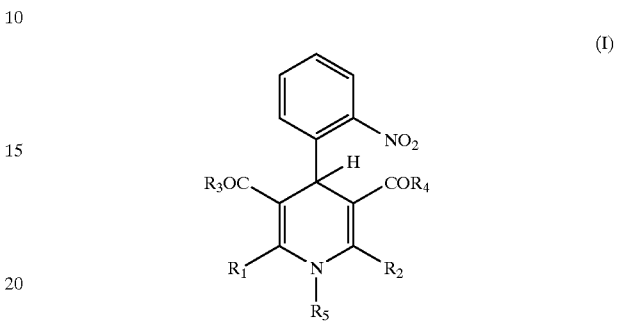

(I)

(wherein $R_1$ and $R_2$ each represent a hydrogen atom or an alkyl group having 1–4 carbon atoms; $R_3$ and $R_4$ each represent an alkyl or alkoxy group each having 1–4 carbon atoms; and $R_5$ represents a hydrogen atom, an alkyl group having 1–4 carbon atoms, or a carboxyalkyl group in which the alkyl moiety has 1–4 carbon atoms).

Examples of this 1,4-dihydropyridine derivative hence include 1-ethyl-3,5-dimethoxycarbonyl-4-(2-nitrophenyl)-1,4-dihydropyridine, 1,2,6-trimethyl-3,5-dimethoxycarbonyl-4-(2-nitrophenyl)-1,4-dihydropyridine, 2,6-dimethyl-3,5-diacetyl-4-(2-nitrophenyl)-1,4-dihydropyridine, and 1-carboxyethyl-3,5-dimethoxycarbonyl-4-(2-nitrophenyl)-1,4-dihydropyridine. These 1,4-dihydropyridine derivatives may be used alone or in combination of two or more thereof. In the present invention, 1-ethyl-3,5-dimethoxycarbonyl-4-(2-nitrophenyl)-1,4-dihydropyridine is especially preferred of those 1,4-dihydropyridine derivatives.

In the photosensitive resin composition of the present invention, the 1,4-dihydropyridine derivative is used in an amount in the range of generally 5–25 parts by weight per 100 parts by weight of the sum of the tetracarboxylic dianhydride ingredient and the diamine ingredient. In case where the amount of the 1,4-dihydropyridine derivative in the photosensitive resin composition is larger than 25 parts by weight per 100 parts by weight of the sum of the tetracarboxylic dianhydride and the diamine, this photosensitive resin composition may give a polyimide film having reduced properties. In case where the amount thereof is smaller than 5 parts by weight, the resultant photosensitive resin composition has reduced pattern-forming properties.

The imide acrylate compound in the present invention is represented by general formula (II):

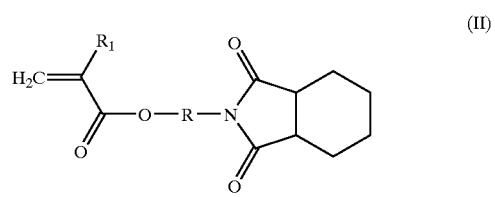

(II)

(wherein $R_1$ represents a hydrogen atom or methyl and R represents a hydrocarbon group having 2 or more carbon atoms). R is preferably an alkylene group, most preferably ethylene. Examples of this imide acrylate compound hence include N-acryloyloxyethylhexahydrophthalimide.

In the photosensitive resin composition of the present invention, the imide acrylate compound is used in an amount in the range of generally 10–30 parts by weight per 100 parts by weight of the sum of the tetracarboxylic dianhydride and the diamine.

The method of forming a pattern comprising a polyimide from the photosensitive resin composition of the invention is explained next. As stated above, the photosensitive resin composition of the invention can be obtained by yielding a poly(amic acid) in an organic solvent and mixing the 1,4-dihydropyridine derivative and the imide acrylate compound with the poly(amic acid) solution to dissolve these ingredients. This composition is applied to a wafer by, e.g., spin coating and dried to form a film. Subsequently, this film is exposed to light through a photomask and then heated at a temperature of generally 120–190° C. for about 2–10 minutes (post-exposure heating).

As a result of the exposure and the post-exposing heating, the exposed areas of the film formed from the photosensitive resin composition of the present invention come to have lower solubility in a developer than the unexposed areas. The film hence forms a negative latent image. This film, which has such a negative latent image, is treated with an aqueous alkali solution to dissolve away the unexposed areas, i.e., to develop the film, whereby a negative image can be obtained. Thereafter, this negative image is heated to a high temperature in an inert gas atmosphere such as nitrogen or under vacuum to thereby cause the poly(amic acid) constituting the negative image to undergo cyclization and imidization and simultaneously pyrolyze and volatilize the 1,4-dihydropyridine derivative present as a photosensitizer in the negative image. Thus, a pattern comprising a polyimide film can be obtained.

Examples of the organic solvent include the aforementioned and other solvents such as N-methyl-2-pyrrolidone, N,N-dimethylacetamide, N,N-dimethylformamide, and dimethyl sulfoxide.

For exposing the film formed from the photosensitive resin composition of the present invention, actinic rays such as ultraviolet or electron beams can be used. When the film formed from the photosensitive resin composition is exposed to ultraviolet, the wavelength of the exposure light is in the range of generally 300–450 nm, preferably 360–440 nm, and the integrated exposure amount is in the range of generally 100–1,000 mJ/cm$^2$, preferably 200–700 mJ/cm$^2$.

As the aqueous alkali solution, which is a developing solution, can be used, for example, an aqueous solution of an inorganic alkali such as sodium hydroxide or potassium hydroxide or an aqueous solution of an organic alkali such as tetramethylammonium hydroxide. It is, however, desirable to use an aqueous solution of an organic alkali so as to avoid semiconductor fouling. A dissolution control agent such as, e.g., an alcohol may be added to the developing solution according to need. Usable development methods include the immersion method, spraying method, and paddle method. The development may be conducted at room temperature or with heating according to need.

The heating temperature for polyimide formation is generally in the range of 250–450° C. In case where the heating temperature for polyimide formation is lower than 250° C., there is the possibility that part of the 1,4-dihydropyridine derivative might remain in the polyimide film to prevent the resultant polyimide film from having desirable properties. On the other hand, in case where the temperature exceeds 450° C., there is the possibility that the polyimide itself might deteriorate. The heating temperature for polyimide formation is preferably in the range of 300–400° C.

The present invention will be explained below by reference to Examples, but the invention should not be construed as being limited by these Examples in any way.

EXAMPLE 1

In N,N-dimethylacetamide, 5.88 g of p-phenylenediamine, 2.04 g of 4,4'-diaminodiphenyl ether, and 0.84 g of 1,3-bis(3-aminopropyl)-1,1,3,3-tetramethyldisiloxane were reacted with 20.0 g of 3,3',4,4'-biphenyltetracarboxylic dianhydride at room temperature to obtain a solution of a poly(amic acid). In this poly(amic acid) solution were dissolved 2.88 g of 1-ethyl-3,5-dimethoxycarbonyl-4-(2-nitrophenyl)-1,4-dihydropyridine and 5.76 g of N-acryloyloxyethylhexahydrophthalimide. Thus, a photosensitive resin composition was obtained as a homogeneous solution.

Subsequently, the solution of a photosensitive resin composition was applied to a silicon wafer with a spin coater and dried on a 120° C. hot plate for 10 minutes to obtain a coating film having a thickness of 54 μm. This coating film was exposed to ultraviolet through a photomask for 90 seconds using a 250-W ultrahigh-pressure mercury lamp and then heated on a 175° C. hot plate for 10 minutes (post-exposure heating). Subsequently, the unexposed areas of the coating film were dissolved away by the spraying method (temperature, 45° C.; pressure, 0.1 MPa) using a water/ethanol (1/1) solution of tetramethylammonium hydroxide (concentration, 5% by weight). Thereafter, the silicon wafer was rinsed with water to obtain a negative pattern.

The pattern thus obtained was heated at 400° C. for 2 hours in a nitrogen atmosphere to conduct imidization. Thus, a fine pattern comprising a polyimide film was obtained on the silicon wafer. Resolution was determined in terms of the resolution for an equally spaced L&S pattern and that for equally spaced square via holes. The results obtained are shown in Table 1.

EXAMPLE 2

A photosensitive resin composition was obtained as a homogeneous solution in the same manner as in Example 1, except that 1-methyl-3,5-di(t-butoxycarbonyl)-4-(2-nitrophenyl)-1,4-dihydropyridine was used in place of the 1-ethyl-3,5-dimethoxycarbonyl-4-(2-nitrophenyl)-1,4-dihydropyridine. This solution was used to obtain a fine pattern comprising a polyimide film on a silicon wafer in the same manner as in Example 1. Resolution was determined in the same manner as in Example 1. The results obtained are shown in Table 1.

EXAMPLE 3

In N,N-dimethylacetamide, 6.3 g of p-phenylenediamine and 0.76 g of 1,3-bis(3-aminopropyl)-1,1,3,3-tetramethyldisiloxane were reacted with 10.8 g of 3,3',4,4'-biphenyltetracarboxylic dianhydride and 10.9 g of 2,2-bis(3,4-dicarboxyphenyl)hexafluoropropane dianhydride to obtain a solution of a poly(amic acid).

A photosensitive resin composition was obtained as a homogeneous solution in the same manner as in Example 1, except that the poly(amic acid) solution prepared above was used. This composition was used to obtain a fine pattern comprising a polyimide film on a silicon wafer in the same manner as in Example 1. Resolution was determined in the same manner as in Example 1. The results obtained are shown in Table 1.

COMPARATIVE EXAMPLE 1

In N,N-dimethylacetamide, 5.88 g of p-phenylenediamine, 2.04 g of 4,4'-diaminodiphenyl ether, and 0.84 g of 1,3-bis(3-aminopropyl)-1,1,3,3-tetramethyldisiloxane were reacted with 20.0 g of 3,3',4,4'-biphenyltetracarboxylic dianhydride at room temperature to obtain a solution of a poly(amic acid). In this solution was dissolved 2.88 g of 1-ethyl-3,5-dimethoxycarbonyl-4-(2-nitrophenyl)-1,4-dihydropyridine. Thus, a photosensitive resin composition was obtained as a homogeneous solution.

Formation of a negative pattern comprising a polyimide film was attempted in the same manner as in Example 1, except that the photosensitive resin composition obtained above was used. However, the development after exposure of the coating film of the photosensitive resin composition failed to completely dissolve away the unexposed areas. This is because the photosensitive resin composition did not contain N-acryloyloxyethylhexahydrophthalimide.

COMPARATIVE EXAMPLE 2

A photosensitive resin composition was obtained as a homogeneous solution in the same manner as in Example 1, except that polyethylene glycol having a weight-average molecular weight of 600 was used in place of the N-acryloyloxyethylhexahydrophthalimide. This composition was used to obtain a fine pattern comprising a polyimide film on a silicon wafer in the same manner as in Example 1. Resolution was determined in the same manner as in Example 1. The results obtained are shown in Table 1.

TABLE 1

|  | Example | | | Comparative Example | |
| --- | --- | --- | --- | --- | --- |
|  | 1 | 2 | 3 | 1 | 2 |
| Coating film thickness (after drying) (μm) | 54 | 55 | 57 | 54 | 54 |
| Coating film thickness after post-exposure heating (μm) | 38 | 38 | 40 | 36 | 38 |
| Film thickness after development (μm) | 38 | 37 | 40 | 36 | 37 |
| Film thickness after imidization (μm) | 28 | 27 | 30 | 26 | 27 |
| Resolution (L&S) (μm) | 20 | 20 | 20 | — | 40 |
| Resolution (square via holes) (μm) | 30 | 30 | 30 | — | 50 |

While the invention has been described in detail and with reference to specific embodiments thereof, it will be apparent to one skilled in the art that various changes and modifications can be made therein without departing from the scope thereof.

This application is based on Japanese patent application No. 2004-076146 filed Mar. 17, 2004, the entire contents thereof being hereby incorporated by reference.

What is claimed is:

1. A photosensitive resin composition which comprises:
   (a) a poly(amic acid),
   (b) a 1,4-dihydropyridine derivative represented by the general formula (I):

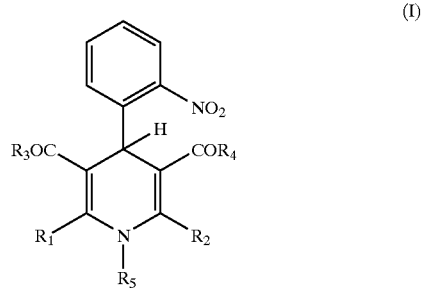

wherein $R_1$ and $R_2$ each independently represent a hydrogen atom or an alkyl group having 1–4 carbon atoms; $R_3$ and $R_4$ each independently represent an alkyl or alkoxy group each having 1–4 carbon atoms; and $R_5$ represents a hydrogen atom, an alkyl group having 1–4 carbon atoms, or a carboxyalkyl group in which the alkyl moiety has 1–4 carbon atoms, and (c) an imide acrylate compound represented by the general formula (II):

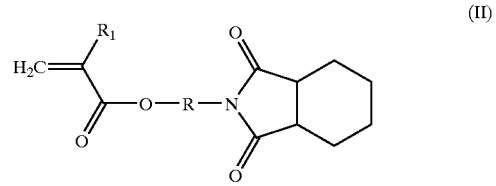

wherein $R_1$ represents a hydrogen atom or methyl and R represents a hydrocarbon group having 2 or more carbon atoms.

2. A method of forming a pattern comprising a polyimide film, which comprises forming a film of the photosensitive resin composition of claim 1, exposing the film to light through a photomask, subjecting the film to post-exposure heating, developing the film, and then heating the developed film to imidize the poly(amic acid).

3. The method of forming a pattern comprising a polyimide film of claim 2, wherein the polyimide film has a thickness of 20 μm or larger.

* * * * *